(12) United States Patent  
Lin

(10) Patent No.: US 9,799,624 B1  
(45) Date of Patent: Oct. 24, 2017

(54) WIRE BONDING METHOD AND WIRE BONDING STRUCTURE

(71) Applicant: NANYA TECHNOLOGY CORPORATION, Taoyuan (TW)

(72) Inventor: Po-Chun Lin, Changhua County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 15/239,809

(22) Filed: Aug. 17, 2016

(51) Int. Cl.
  *H01L 23/48* (2006.01)
  *H01L 23/00* (2006.01)

(52) U.S. Cl.
  CPC .............. *H01L 24/45* (2013.01); *H01L 24/05* (2013.01); *H01L 24/85* (2013.01); *H01L 2224/04042* (2013.01); *H01L 2224/05624* (2013.01); *H01L 2224/45647* (2013.01)

(58) Field of Classification Search
  CPC ..... H01L 2224/45; H01L 24/85; H01L 24/44; H01L 24/45; H01L 24/05
  See application file for complete search history.

(56) References Cited

U.S. PATENT DOCUMENTS

| 2006/0186179 A1* | 8/2006 | Levine | B23K 20/007 228/180.5 |
| 2015/0145148 A1* | 5/2015 | Tran | H01L 24/13 257/780 |
| 2015/0311173 A1* | 10/2015 | Carpenter | H01L 24/05 257/784 |

FOREIGN PATENT DOCUMENTS

| CN | 103339719 A | * 10/2013 | ............ H01L 24/45 |
| TW | 200636890 A | 10/2006 | |
| TW | 201521130 A | 6/2015 | |

* cited by examiner

*Primary Examiner* — Selim Ahmed  
*Assistant Examiner* — Evan Clinton  
(74) *Attorney, Agent, or Firm* — CKC & Partners Co., Ltd.

(57) ABSTRACT

A wire bonding method includes steps of: forming a Free Air Ball (FAB) at an end of a metal wire; pressing the FAB onto a flat surface of a workpiece to deform the FAB; contacting the deformed FAB to a metal pad, wherein the metal pad is made of a first material and the metal wire is made of a second material, and a hardness of the first material is smaller than a hardness of the second material; and bonding the deformed FAB on the metal pad.

8 Claims, 5 Drawing Sheets

WIRE BONDING METHOD AND WIRE BONDING STRUCTURE

BACKGROUND

Technical Field

The present disclosure relates to a wire bonding method and a wire bonding structure.

Description of Related Art

A semiconductor die is a small integrated circuit formed on a semiconductor wafer. The die is cut from the wafer and then attached to a substrate or semiconductor chip carrier. Bonding pads on the semiconductor die are electrically connected to electrical contacts on the carrier (also known as leads or lead fingers) using bond wires with wire bonding equipment. Wire bonding is a solid phase process that uses a combination of heat, pressure and ultrasonic energy to form a connection between a bond wire and the bonding pads and carrier leads.

As shown in FIG. 1, in semiconductor device assembly of wire bond type devices, a first, ball bond 110 is typically used to attach a tip of the wire 100 to a bonding pad 200 on the die. The ball bond 110 is formed by applying a high voltage electrical charge to the tip of the wire 100, which melts the tip such that a ball is formed at the tip. The ball bond 110 is then welded to the bonding pad 200. The wire 100 is then moved to one of the leads of the carrier and a second bond is formed to attach the other end of the wire 100 to the lead of the chip carrier.

During the bonding, the ball is firstly pressed onto the bonding pad 200 on the die, so that the ball is deformed to increase the contacting area between the ball and the bonding pad 200 before being welded. Once a predetermined force with which the ball is pressed onto the bonding pad is satisfied, an ultrasonic energy is applied to heat and melt the contacting interface of the deformed ball (i.e., the ball bond 110) and the bonding pad 200. After the molten contacting interface is cooled, the ball bond 110 and the bonding pad 200 are welded.

However, if the hardness of the wire 100 is greater than that of the bonding pad 200, the ball bond 110 will sink into the bonding pad 200 and the bonding pad 200 will correspondingly splash during the pressing of the ball bond 110 onto the bonding pad 200 and/or the applying of the ultrasonic energy. Once the thickness of the bonding pad 200 is too thin, the pressing and/or the applying may easily damage the die (e.g., produce cracks), which may further affect the interconnection structures and thus cause abnormal electrical signals. That is, the thin bonding pad 200 cannot provide a cushioning effect to the die. To solve the problem, the thickness of the bonding pad 200 can be increased, but the cost is also increased.

Accordingly, how to provide a wire bonding method to solve the aforementioned problems becomes an important issue to be solved by those in the industry.

SUMMARY

An aspect of the disclosure is to provide a wire bonding method that can bond a FAB of a wire onto a thin metal pad without damaging the substrate which the metal pad is disposed on.

According to an embodiment of the disclosure, the wire bonding method includes steps of: forming a Free Air Ball (FAB) at an end of a metal wire; pressing the FAB onto a flat surface of a workpiece to deform the FAB; contacting the deformed FAB to a metal pad, wherein the metal pad is made of a first material and the metal wire is made of a second material, and a hardness of the first material is smaller than a hardness of the second material; and bonding the deformed FAB on the metal pad.

In an embodiment of the disclosure, the contacting is performed with a force.

In an embodiment of the disclosure, the contacting and the bonding are substantially performed at the same time.

In an embodiment of the disclosure, the pressing is performed with a force greater than the force with which the contacting is performed.

In an embodiment of the disclosure, the pressing forms a flat contacting surface on the FAB corresponding to the flat surface.

In an embodiment of the disclosure, the bonding includes bonding the flat contacting surface on the metal pad.

In an embodiment of the disclosure, the bonding forms an intermetallic compound (IMC) at a contacting interface of the deformed FAB and the metal pad.

In an embodiment of the disclosure, the bonding is performed by applying an ultrasonic energy to a contacting interface of the deformed FAB and the metal pad.

Another aspect of the disclosure is to provide a wire bonding structure including a thin metal pad and a metal wire having a FAB bonding onto the metal pad and sinking into the metal pad with a very small depth.

According to an embodiment of the disclosure, the wire bonding structure includes a metal pad and a metal wire. The metal pad is made of a first material. The metal wire has a deformed FAB. The deformed FAB has a flat contacting surface bonded on the metal pad. The metal wire is made of a second material. A hardness of the first material is smaller than a hardness of the second material. The flat contacting surface sinks into the metal pad with a depth. A ratio of the depth to a thickness of the metal pad is smaller than 0.5.

In an embodiment of the disclosure, the first material is aluminum.

In an embodiment of the disclosure, the second material is copper or copper alloy.

In an embodiment of the disclosure, the copper alloy includes copper, palladium, and gold.

In an embodiment of the disclosure, IMC is formed at the contacting interface of the flat contacting surface and the metal pad.

In an embodiment of the disclosure, the wire bonding structure further includes a substrate. The metal pad is disposed on the substrate.

In an embodiment of the disclosure, the substrate is a silicon substrate or an oxide substrate.

In an embodiment of the disclosure, the thickness of the metal pad is in a range from about 0.01 µm to about 6 µm.

Accordingly, the wire bonding method of the disclosure is performed to deform the FAB of the metal wire to obtain the flat contacting surface by using the workpiece in advance, so the deformed FAB can be gently pressed onto the bonding pad during the subsequent bonding operation. As a result, the wire bonding method of the disclosure can effectively reduce the consumption of the bonding pad (almost no splash) and keep the original thickness of the bonding pad as possible, and the conventional problem that the structure under the bonding pad is damaged when the FAB is pressed onto the bonding pad with a high pressure can be prevented.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
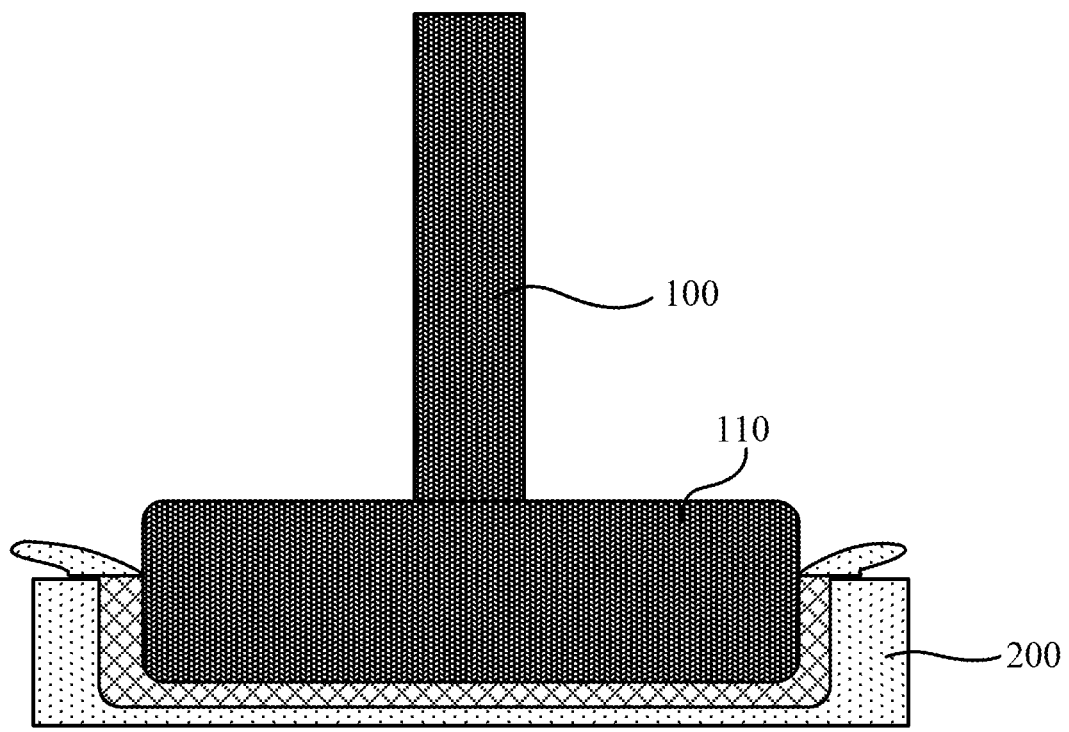
FIG. 1 is a sectional schematic view of a wire bonding process in the prior art.

Reference will now be made in detail to the present embodiments of the disclosure, examples of which are illustrated in the accompanying drawings. Wherever possible, the same reference numbers are used in the drawings and the description to refer to the same or like parts.

Figure 2:
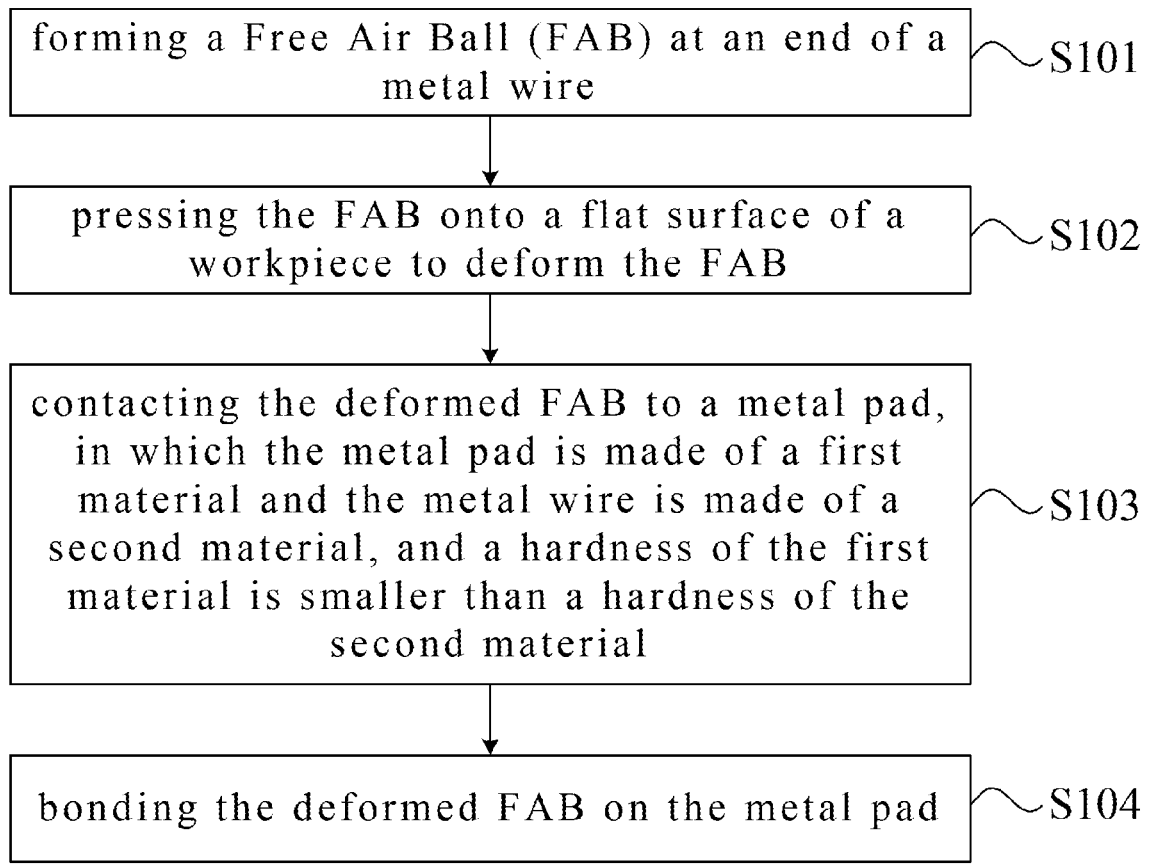
FIG. 2 is a flowchart of a wire bonding method according to an embodiment of the disclosure.
Figure 3:
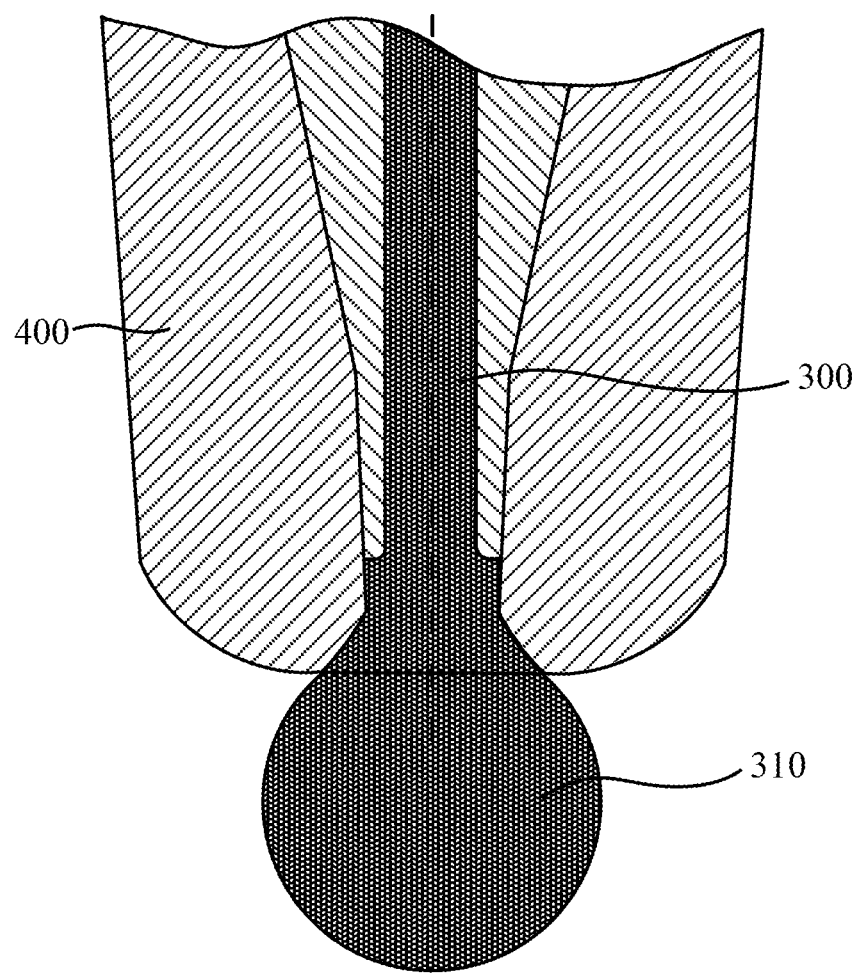
FIG. 3 is a sectional schematic a wire bonding first step according to an embodiment of the disclosure.
Figure 4:
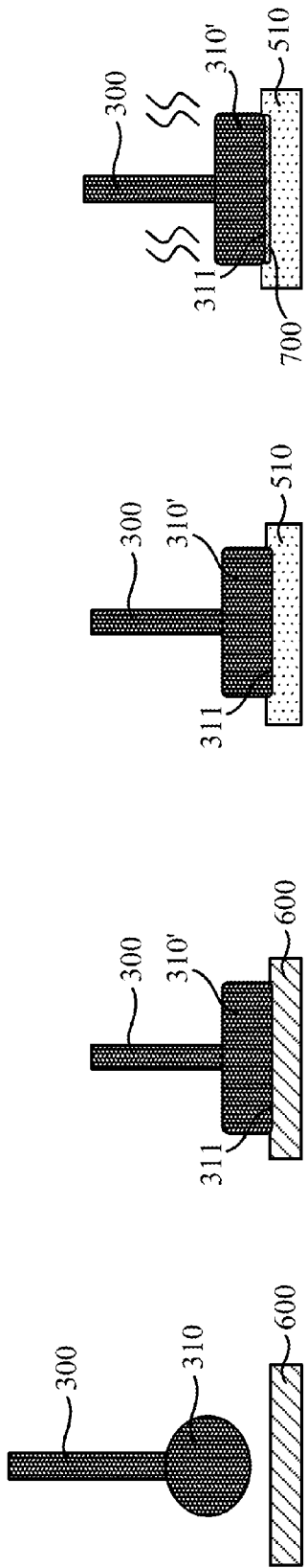
FIG. 4A is another schematic view of the wire bonding first step according to an embodiment of the disclosure.
FIG. 4B is a schematic view of a wire bonding second step according to an embodiment of the disclosure.
FIG. 4C is a schematic view of a wire bonding third step according to an embodiment of the disclosure.
FIG. 4D is a schematic view of a wire bonding fourth step according to an embodiment of the disclosure.

Reference is made to FIGS. 2-4D. FIG. 2 is a flowchart of a wire bonding method according to an embodiment of the disclosure. FIG. 3 is a sectional schematic a wire bonding first step according to an embodiment of the disclosure. FIG. 4A is another schematic view of the wire bonding first step according to an embodiment of the disclosure. FIG. 4B is a schematic view of a wire bonding second step according to an embodiment of the disclosure. FIG. 4C is a schematic view of a wire bonding third step according to an embodiment of the disclosure. FIG. 4D is a schematic view of a wire bonding fourth step according to an embodiment of the disclosure.

The method begins with operation S101 in which a Free Air Ball (FAB) is formed at an end of a metal wire. As shown in FIGS. 3 and 4A, the metal wire 300 is fed into a capillary 400 of a wire bonding machine (not shown). A FAB 310 is formed at a tip of the metal wire 100. The FAB 310 is formed by applying a high voltage electrical charge to the tip of the metal wire 300, which melts the tip such that a ball is formed at the tip. Specifically, the ball formation process is achieved by ionization of an air gap by a process called electronic flame off (EFO). In EFO, electric heating discharge occurs between two electrodes: one electrode is the metal wire 300, typically Copper or Gold (anode) and the other electrode is a flat plate (cathode). The heat produced by an EFO probe during the discharge causes the electrode of the metal wire 300 to melt and surface tension of the molten metal causes the metal to roll up into a ball shape. When a sufficient amount of the metal (metal wire 300) has melted, the discharge is terminated and the molten ball is allowed to solidify. The resulting ball is known as the FAB 310.

The method continues with operation S102 in which the FAB is pressed onto a flat surface of a workpiece to deform the FAB. As shown in FIG. 4B, the FAB 310 is pressed onto a flat surface of a workpiece 600 to deform the FAB 310. In some embodiments, after the operation S102 is performed, a flat contacting surface 311 is formed on the deformed FAB 310' corresponding to the flat surface of the workpiece 600.

In some embodiments, the workpiece 600 can be a plate made of any suitable material. In some embodiments, to properly obtain the flat contacting surface 311 on the deformed FAB 310', a hardness of the workpiece 600 can be greater than a hardness of the FAB 310, but the disclosure is not limited in this regard. In some embodiments, the workpiece 600 can be a metal finger (not shown) on a substrate 500 (see FIG. 5), but the disclosure is not limited in this regard. In some embodiments, workpiece 600 can be a part of a packaging substrate carrying the chip.

The method continues with operation S103 in which the deformed FAB is contacted to a metal pad, in which the metal pad is made of a first material and the metal wire is made of a second material, and a hardness of the first material is smaller than a hardness of the second material. As shown in FIG. 4C, the deformed FAB 310' is contacted to a metal pad 510, in which the metal pad 510 is made of a first material and the metal wire 300 is made of a second material, and a hardness of the first material is smaller than a hardness of the second material. In some embodiments, the first material is aluminum, and the second material is copper or copper alloy, but the disclosure is not limited in this regard. In some embodiments, the copper alloy includes copper, palladium, and gold, but the disclosure is not limited in this regard.

In some embodiments, the contacting (i.e., the operation S103) is performed with a force, and the pressing (i.e., the operation S102) is performed with a force greater than the force with which the contacting is performed. In other words, after the FAB 310 is completely deformed to obtain the flat contacting surface 311, the deformed FAB 310' can be contacted to the metal pad 510 with the smaller force during the subsequent bonding operation, so as to avoid damaging the structure under the metal pad 510 (e.g., the substrate 500 on which the metal pad 510 is disposed, as shown in FIG. 5).

The method continues with operation S104 in which the deformed FAB is bonded on the metal pad. As shown in FIG. 4D, the deformed FAB 310' is bonded on the metal pad 510. In some embodiments, the bonding is performed by applying an ultrasonic energy to a contacting interface of the deformed FAB 310' and the metal pad 510. In some embodiments, the contacting (i.e., the operation S103) and the bonding (i.e., the operation S104) are substantially performed at the same time. In some embodiments, the bonding forms an intermetallic compound (IMC) 700 at a contacting interface of the deformed FAB 310' and the metal pad 510. The IMC 700 can produce a eutectic system at the contacting interface of the deformed FAB 310' and the metal pad 510, so as to bond the deformed FAB 310' and the metal pad 510.

Figure 5:
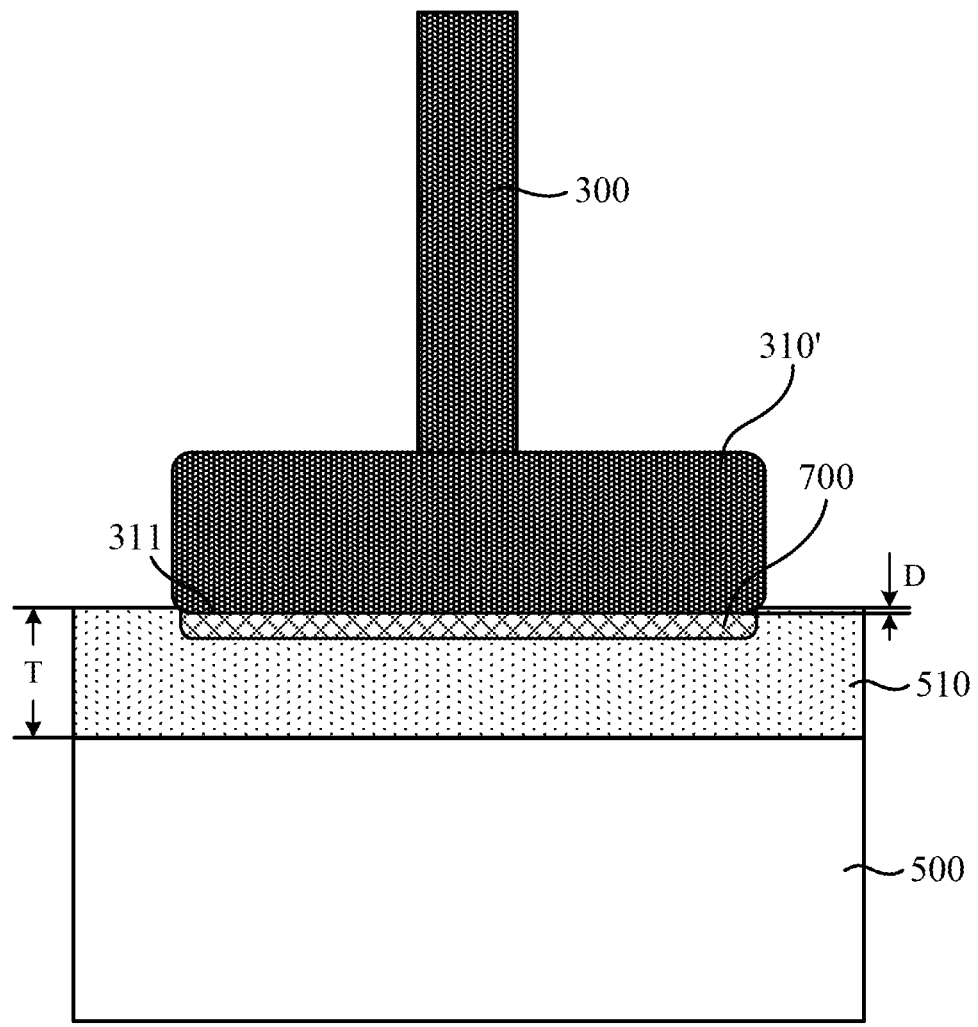
FIG. 5 is a schematic view of a wire bonding structure according to an embodiment of the disclosure.

Reference is made to FIG. 5. FIG. 5 is a schematic view of a wire bonding structure according to an embodiment of the disclosure. The wire bonding structure includes a substrate 500, a metal pad 510, and a metal wire 300. The metal pad 510 is disposed on the substrate 500. The metal pad 510 is made of a first material. The metal wire 300 has a deformed FAB 310' at a tip. The deformed FAB 310' has a flat contacting surface 311 bonded on the metal pad 510. The metal wire 300 is made of a second material. A hardness of the first material is smaller than a hardness of the second material. The flat contacting surface 310 sinks into the metal pad with a depth D. A ratio of the depth D to a thickness T of the metal pad 510 T is smaller than 0.5.

In the embodiment, the metal pad 510 is directly disposed on the substrate 500, but the disclosure is not limited in this regard. In some other embodiments, the metal pad 510 is indirectly disposed on the substrate 500. For example, in some other embodiments, a passivation layer covers the substrate 500, and the metal pad 510 is disposed in the passivation layer.

In some embodiments, the thickness T of the metal pad 510 is in a range from about 0.01 μm to about 6 μm, but the disclosure is not limited in this regard.

In the foregoing structure configuration, the wire bonding structure of the disclosure can include the thin metal pad 510 of the thickness T and the metal wire 300 having the deformed FAB 310' bonding onto the metal pad 510 and sinking into the metal pad 510 with the very small depth D, and the wire bonding structure is manufactured by using the wire bonding method of the disclsoure.

On the contrary, if the deformed FAB 310' is bonded onto the thin metal pad 510 by using a conventional wire bonding method, the flat contacting surface 310 certainly sinks into the metal pad 510 with a greater depth and makes the metal pad 510 splash, and the substrate 500 under the metal pad 510 is very likely damaged due to the small thickness T of the metal pad 510.

In some embodiments, the first material is aluminum, and the second material is copper or copper alloy, but the disclosure is not limited in this regard. In some embodiments, the copper alloy includes copper, palladium, and gold, but the disclosure is not limited in this regard. In some embodiments, IMC is formed at the contacting interface of the flat contacting surface 311 and the metal pad 510. In some embodiments, the substrate 500 is a silicon substrate or an oxide substrate.

According to the foregoing recitations of the embodiments of the disclosure, it can be seen that the wire bonding method of the disclosure is performed to deform the FAB of the metal wire to obtain the flat contacting surface by using the workpiece in advance, so the deformed FAB can be gently pressed onto the bonding pad during the subsequent bonding operation. As a result, the wire bonding method of the disclosure can effectively reduce the consumption of the bonding pad (almost no splash) and keep the original thickness of the bonding pad as possible, and the conventional problem that the structure under the bonding pad is damaged when the FAB is pressed onto the bonding pad with a high pressure can be prevented.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A wire bonding method, comprising:
   forming a Free Air Ball (FAB) at an end of a metal wire;
   pressing the FAB onto a flat surface of a metal finger on a substrate to deform the FAB;
   contacting the deformed FAB to a metal pad on the substrate, wherein the metal pad is made of a first material and the metal wire is made of a second material, and a hardness of the first material is smaller than a hardness of the second material; and
   bonding the deformed FAB on the metal pad to make a portion of the deformed FAB sink into the metal pad.

2. The wire bonding method of claim 1, wherein the contacting is performed with a force.

3. The wire bonding method of claim 2, wherein the contacting and the bonding are substantially performed at the same time.

4. The wire bonding method of claim 2, wherein the pressing is performed with a force greater than the force which the contacting is performed with.

5. The wire bonding method of claim 1, wherein the pressing forms a flat contacting surface on the FAB corresponding to the flat surface.

6. The wire bonding method of claim 5, wherein the bonding comprising bonding the flat contacting surface on the metal pad to make the flat contacting surface sink into the metal pad.

7. The wire bonding method of claim 1, wherein the bonding forms an intermetallic compound (IMC) at a contacting interface of the deformed FAB and the metal pad.

8. The wire bonding method of claim 1, wherein the bonding is performed by applying an ultrasonic energy to a contacting interface of the deformed FAB and the metal pad.

* * * * *